United States Patent
Hung et al.

(10) Patent No.: US 12,381,299 B2
(45) Date of Patent: Aug. 5, 2025

(54) POWER DISTRIBUTION COMPONENT AND WIRELESS TRANSCEIVER

(71) Applicant: Merry Electronics Co., Ltd., Taichung (TW)

(72) Inventors: Tien-Fu Hung, Taichung (TW); Zong-Fu Li, Taichung (TW); Ming-Hung Tsai, Taichung (TW)

(73) Assignee: Merry Electronics Co., Ltd., Taichung (TW)

( * ) Notice: Subject to any disclaimer, the term of this patent is extended or adjusted under 35 U.S.C. 154(b) by 204 days.

(21) Appl. No.: 17/889,374

(22) Filed: Aug. 16, 2022

(65) Prior Publication Data

US 2024/0022050 A1  Jan. 18, 2024

(30) Foreign Application Priority Data

Jul. 18, 2022  (TW) .................................. 111126811

(51) Int. Cl.
 *H01P 3/08* (2006.01)
 *H04B 1/40* (2015.01)
 *H05K 1/02* (2006.01)

(52) U.S. Cl.
 CPC ............... *H01P 3/081* (2013.01); *H04B 1/40* (2013.01); *H05K 1/0213* (2013.01)

(58) Field of Classification Search
 None
 See application file for complete search history.

(56) References Cited

U.S. PATENT DOCUMENTS

| | | | | |
|---|---|---|---|---|
| 6,166,694 A | * | 12/2000 | Ying | H01Q 9/0421 343/702 |
| 6,359,728 B1 | * | 3/2002 | Angellieri | H01S 3/06758 359/345 |
| 11,438,086 B2 | * | 9/2022 | Akasaka | H04B 10/294 |
| 2008/0291528 A1 | * | 11/2008 | Susumu | G02F 1/3501 359/326 |
| 2009/0295667 A1 | * | 12/2009 | Ma | H01Q 1/2225 343/795 |
| 2022/0320724 A1 | * | 10/2022 | Deng | H01Q 1/523 |

FOREIGN PATENT DOCUMENTS

| | | | | |
|---|---|---|---|---|
| CN | 202678512 U | * | 1/2013 | |
| CN | 102005645 B | * | 2/2013 | |
| CN | 203056090 U | * | 7/2013 | |
| EP | 408836 A1 | * | 11/2022 | |

* cited by examiner

*Primary Examiner* — Courtney L Smith
(74) *Attorney, Agent, or Firm* — JCIPRNET (57) ABSTRACT

A power distribution component includes a wavelength converter, a connecting portion, a first power distribution portion and a second power distribution portion. The wavelength converter has an input end and a connection end. The connecting portion includes a first connecting end and a second connecting end, and the first connecting end is connected to the connection end. The first power distribution portion includes a first output port and a first end, and the first end is connected to the second connecting end. The second power distribution portion includes a second output port and a second end, and the second end is connected to the second connecting end. The first power distribution portion and the second power distribution portion are symmetrically disposed on opposite sides of the connecting portion by regarding the connecting portion as a mirror axis. Additionally, a wireless transceiver including a power distribution component is also provided.

8 Claims, 6 Drawing Sheets

POWER DISTRIBUTION COMPONENT AND WIRELESS TRANSCEIVER

CROSS-REFERENCE TO RELATED APPLICATION

This application claims the priority benefit of Taiwan application serial no. 111126811, filed on Jul. 18, 2022. The entirety of the above-mentioned patent application is hereby incorporated by reference herein and made a part of this specification.

BACKGROUND

Technical Field

The disclosure relates to a distribution component and a transceiver including the distribution component, and in particular relates to a power distribution component and a wireless transceiver including the power distribution component.

Description of Related Art

At present, when disposing the internal antenna of the USB wireless transceiver (USB dongle) including an audio jack on the market, the disposing position of the antenna avoids the disposing position of the audio jack. Alternatively, two sets of antennas are disposed on the USB wireless transceiver, and the operation state of the antennas is switched by switches, so as to avoid the antennas from being shielded by the audio jack and affecting their radiation performance.

However, the disposing position of the antenna disposed to avoid the audio jack is easily deviated to a certain side of the USB wireless transceiver, and the antenna pattern distribution is also easily deviated to a certain side, resulting in a blind spot for signal reception. The two sets of antennas disposed on the USB wireless transceiver that use switches to switch the operation states of the antennas require higher manufacturing costs. Therefore, the way for the USB wireless transceiver including the audio jack to have good antenna radiation efficiency without increasing the cost of the USB wireless transceiver is an important research direction in this field.

SUMMARY

The disclosure provides a power distribution component and a wireless transceiver, which has good power distribution performance and good antenna radiation performance, respectively.

The power distribution component of the disclosure includes a wavelength converter, a connecting portion, a first power distribution portion, and a second power distribution portion. The wavelength converter has an input end and a connection end. The connecting portion includes a first connecting end and a second connecting end, and the first connecting end is connected to the connection end of the wavelength converter. The first power distribution portion includes a first output port and a first end, and the first end is connected to the second connecting end of the connecting portion. The second power distribution portion includes a second output port and a second end, and the second end is connected to the second connecting end of the connecting portion. The first power distribution portion and the second power distribution portion are symmetrically disposed on opposite sides of the connecting portion by regarding the connecting portion as a mirror axis.

The wireless transceiver of the disclosure includes a circuit board, an audio jack, a chip, a power distribution component, and two antenna components. The audio jack is disposed on an edge of the circuit board, and the chip is disposed on the circuit board. The power distribution component is disposed on the circuit board and is electrically connected to the chip. The two antenna components are disposed on the circuit board and are electrically connected to the power distribution component. The two antenna components are symmetrical and are symmetrically disposed on opposite sides of the audio jack.

In an embodiment of the disclosure, the first output port of the first power distribution portion and the second output port of the second power distribution portion are adapted to be respectively connected to two antenna components, the two antenna components are adapted to resonate in a frequency band, and the wavelength converter includes a microstrip whose length is ¼ times a wavelength of the frequency band.

In an embodiment of the disclosure, a width of the connecting portion is greater than a width of the microstrip, and the width of the microstrip is greater than a width of either one of the first power distribution portion or the second power distribution portion.

In an embodiment of the disclosure, the microstrip includes multiple first sections that are bent and connected in sequence, and among the first sections, a distance between any two adjacent and parallel first sections is between 0.1 mm to 0.3 mm.

In an embodiment of the disclosure, either one of the first power distribution portion or the second power distribution portion includes multiple second sections that are bent and connected in sequence, and among the second sections, a distance between any two adjacent and parallel second sections is between 0.1 mm and 0.6 mm.

In an embodiment of the disclosure, a distance between one of the second sections that is closest to and parallel to the connecting portion and the connecting portion is between 0.1 mm and 0.3 mm.

In an embodiment of the disclosure, a length of the first power distribution portion and the second power distribution portion along an extending direction of the connecting portion is between 1.8 mm and 2 mm.

In an embodiment of the disclosure, a length of the power distribution component is between 6 mm and 10 mm, and a width is between 4 mm and 6 mm.

In an embodiment of the disclosure, the first output port of the first power distribution portion and the second output port of the second power distribution portion are adapted to be respectively connected to two antenna components. The two antenna components are adapted to resonate in a frequency band, a length of either one of the first power distribution portion or the second power distribution portion is ¼ times a wavelength of the frequency band.

Based on the above, in the power distribution component of the disclosure, because the first power distribution portion and the second power distribution portion are symmetrically disposed on opposite sides of the connecting portion by regarding the connecting portion as the mirror axis, the power distribution component may effectively divide the output power into two and subsequently transmit the output power to the two antenna components electrically connected to the power distribution component. The two antenna components may operate independently at the same time due to the divided output power.

In addition, in the wireless transceiver of the disclosure, the two antenna components connected to the power distribution component are symmetrical and are symmetrically disposed on opposite sides of the audio jack. Thereby, the two antenna components may avoid the shielding of the audio jack and have good radiation performance, and the two antenna components may achieve excellent omnidirectional effects after combining the antenna patterns located on opposite sides of the audio jack. Furthermore, compared with the wireless transceiver including switches of the prior art, the wireless transceiver of the disclosure has good antenna radiation performance because two antenna components are disposed on opposite sides of the audio jack, thereby there is no need to dispose a switch for switching the operation state of the antenna, thus saving the cost of disposing a switch on the wireless transceiver.

DETAILED DESCRIPTION OF DISCLOSED EMBODIMENTS

Figure 1:
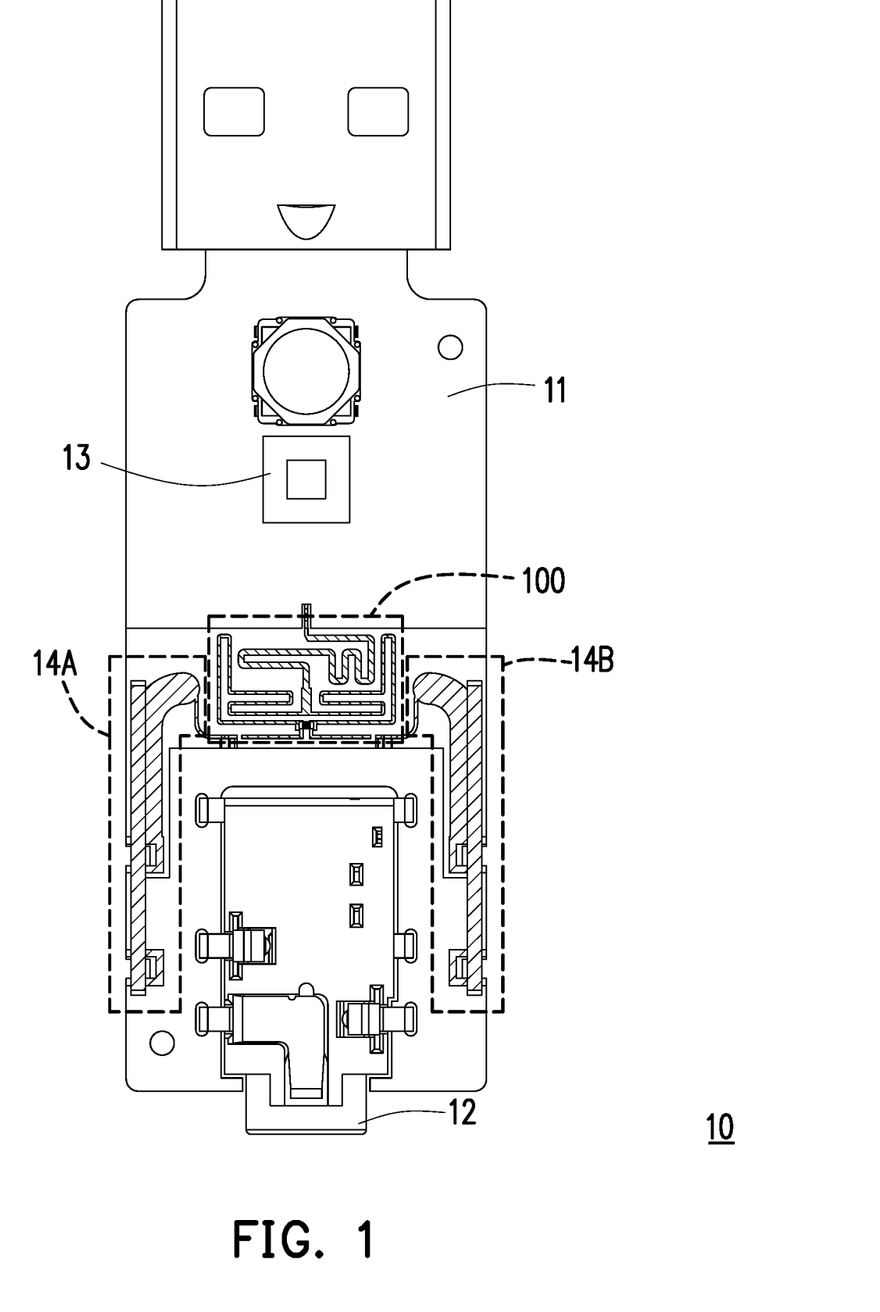
FIG. 1 is a top view of a wireless transceiver according to an embodiment of the disclosure.

FIG. 1 is a top view of a wireless transceiver according to an embodiment of the disclosure. Referring to FIG. 1, a wireless transceiver 10 of this embodiment includes a circuit board 11, an audio jack 12, a chip 13, a power distribution component 100, and two antenna components 14A and 14B. The audio jack 12 is disposed on an edge of the circuit board 11, and the chip 13 is disposed on the circuit board 11. The power distribution component 100 is disposed on the circuit board 11 and is electrically connected to the chip 13. The two antenna components 14A and 14B are disposed on the circuit board 11 and are electrically connected to the power distribution component 100. In addition, the two antenna components 14A, 14B are symmetrical and are symmetrically disposed on opposite sides of the audio jack 12.

Figure 2:
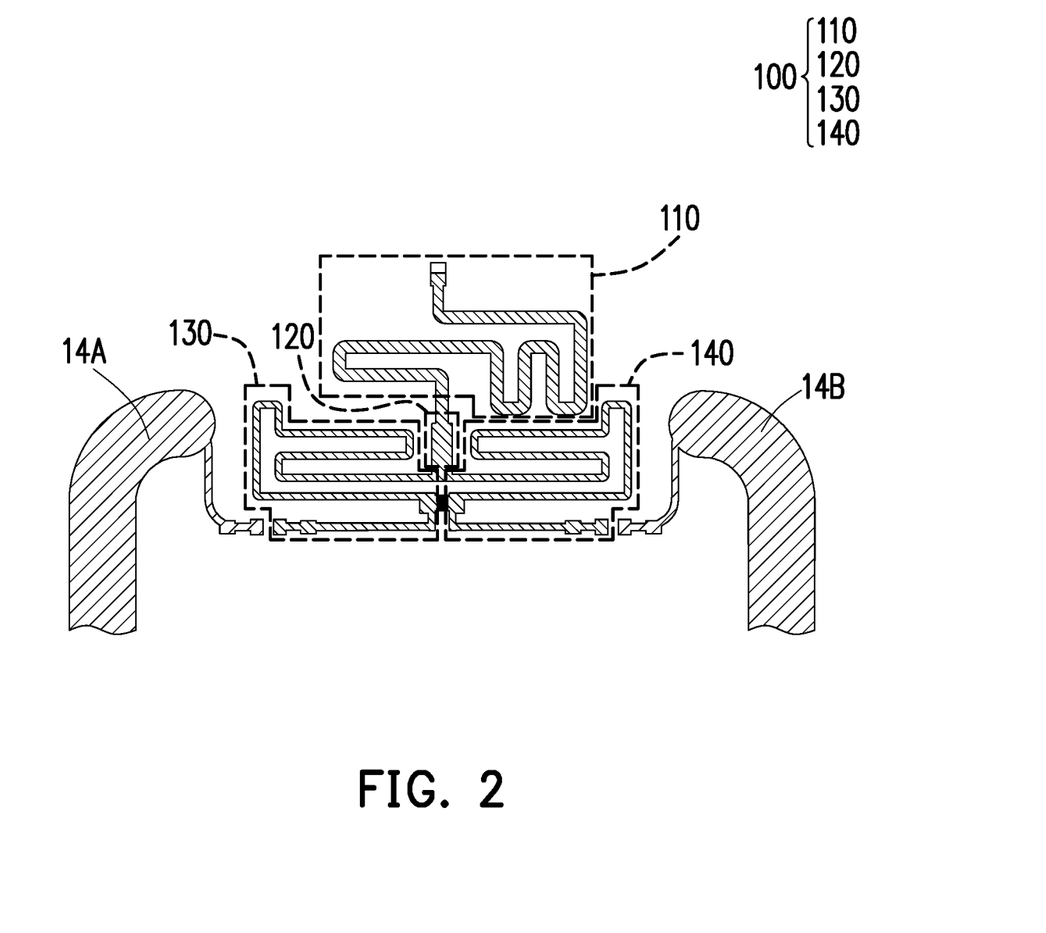
FIG. 2 is a partially enlarged top view of the wireless transceiver of FIG. 1.
Figure 3:
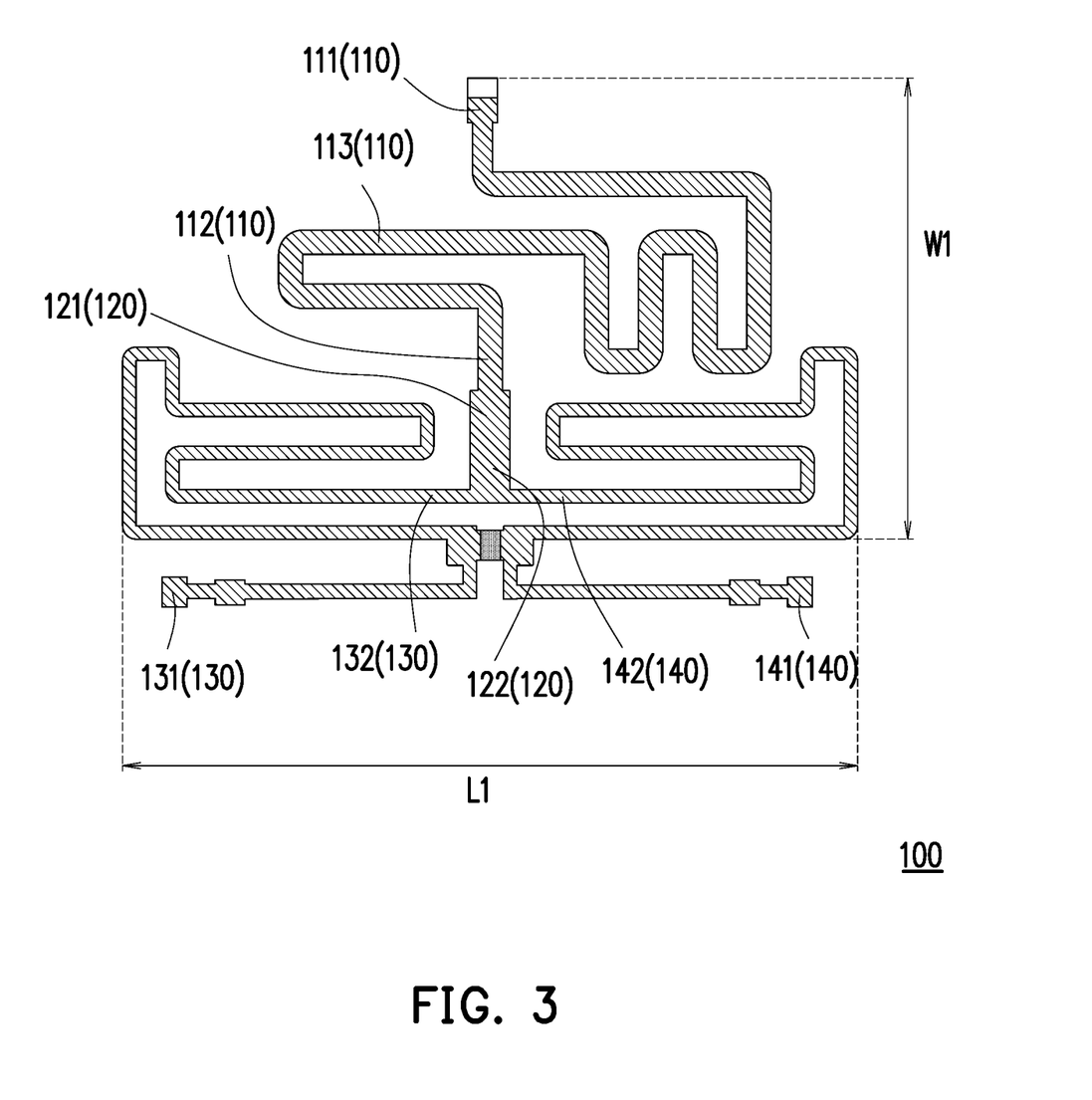
FIG. 3 is a top schematic view of a power distribution component of the wireless transceiver of FIG. 1.

FIG. 2 is a partially enlarged top view of the wireless transceiver of FIG. 1, and FIG. 3 is a top schematic view of a power distribution component of the wireless transceiver of FIG. 1. Referring to FIG. 1 to FIG. 3, the power distribution component 100 of this embodiment includes a wavelength converter 110, a connecting portion 120, a first power distribution portion 130, and a second power distribution portion 140. The wavelength converter 110 is connected to the chip 13 (FIG. 1), and the wavelength converter 110 has an input end 111 and a connection end 112 as shown in FIG. 3. The connecting portion 120 includes a first connecting end 121 and a second connecting end 122, and the first connecting end 121 is connected to the connection end 112 of the wavelength converter 110.

In this embodiment, the first power distribution portion 130 includes a first output port 131 and a first end 132, and the first end 132 is connected to the second connecting end 122 of the connecting portion 120. The second power distribution portion 140 includes a second output port 141 and a second end 142, and the second end 142 is connected to the second connecting end 122 of the connecting portion 120. As shown in FIG. 2 and FIG. 3, the first power distribution portion 130 and the second power distribution portion 140 are symmetrically disposed on the opposite sides of the connecting portion 120 by regarding the connecting portion 120 as a mirror axis, and the first power distribution portion 130 and the second power distribution portion 140 are connected to the two antenna components 14A and 14B (FIG. 1 and FIG. 2).

Further, the first output port 131 of the first power distribution portion 130 and the second output port 141 of the second power distribution portion 140 in this embodiment are adapted to be connected to the two antenna components 14A and 14B, respectively. The first power distribution portion 130 is connected to the antenna component 14A located on one side of the audio jack 12 (FIG. 1) through the first output port 131, and the second power distribution portion 140 is connected to the antenna component 14B located on the other side of the audio jack 12 (FIG. 1) through the second output port 141.

In this way, because the first power distribution portion 130 and the second power distribution portion 140 are symmetrically disposed on opposite sides of the connecting portion 120 by regarding the connecting portion 120 as the mirror axis, the power distribution component 100 of this embodiment may effectively divide the output power into two and subsequently transmit the output power into the two antenna components 14A, 14B electrically connected to the power distribution component 100. The two antenna components 14A, 14B may operate independently at the same time due to the divided output power.

In addition, the first power distribution portion 130 and the second power distribution portion 140 of this embodiment respectively transmit the equally divided power to the antenna component 14A and the antenna component 14B located on the two sides of the audio jack 12 through the first output port 131 and the second output port 141. Thereby, the antenna component 14A and the antenna component 14B may avoid the shielding of the audio jack 12 and have good radiation performance, and the antenna component 14A and the antenna component 14B may achieve excellent omnidirectional effects after combining the antenna patterns located on opposite sides of the audio jack 12.

Furthermore, compared with the wireless transceiver including switches of the prior art, the wireless transceiver 10 of this embodiment has good antenna radiation performance because the two antenna components 14A, 14B are disposed on opposite sides of the audio jack 12, thereby there is no need to dispose a switch for switching the operation state of the antenna, thus saving the cost of disposing a switch on the wireless transceiver 10.

In this embodiment, the antenna component 14A and the antenna component 14B of the wireless transceiver 10 are adapted for coupling a frequency band, and the value of the frequency band is 2.4 GHz. The wavelength converter 110 includes a microstrip 113 whose length is ¼ times the wavelength of the frequency band, and the length of either one of the first power distribution portion 130 or the second power distribution portion 140 is ¼ times the wavelength of the frequency band. It is worth mentioning that, in the wireless transceiver 10 of this embodiment, the lengths of the microstrip 113, the first power distribution portion 130, and the second power distribution portion 140 may be adjusted so that both the antenna component 14A and the antenna component 14B may resonate in an ideal frequency band and achieve the effect of a customized design, the disclosure does not limit the value of the frequency band resonated by the wireless transceiver 10 and the lengths of the microstrip 113, the first power distribution portion 130, and the second power distribution portion 140.

In addition, the width of the connecting portion 120 in this embodiment is greater than the width of the microstrip 113, and the width of the microstrip 113 is greater than the width of either one of the first power distribution portion 130 or the second power distribution portion 140. The impedance of the connecting portion 120 is 25 ohms, the impedance of the microstrip 113 is ohms, and the impedances of the first power distribution portion 130 and the second power distribution portion 140 are both 50 ohms. It should be noted that, the connecting portion 120, the microstrip 113, the first power distribution portion 130, and the second power distribution portion 140 in this embodiment may achieve ideal impedance matching by adjusting their respective widths, so that both the first output port 131 of the first power distribution portion 130 and the second output port 141 of the second power distribution portion 140 may obtain an ideal output impedance and achieve a customized effect, the disclosure does not limit the widths of the connecting portion 120, the microstrip 113, the first power distribution portion 130, and the second power distribution portion 140.

Figure 4:
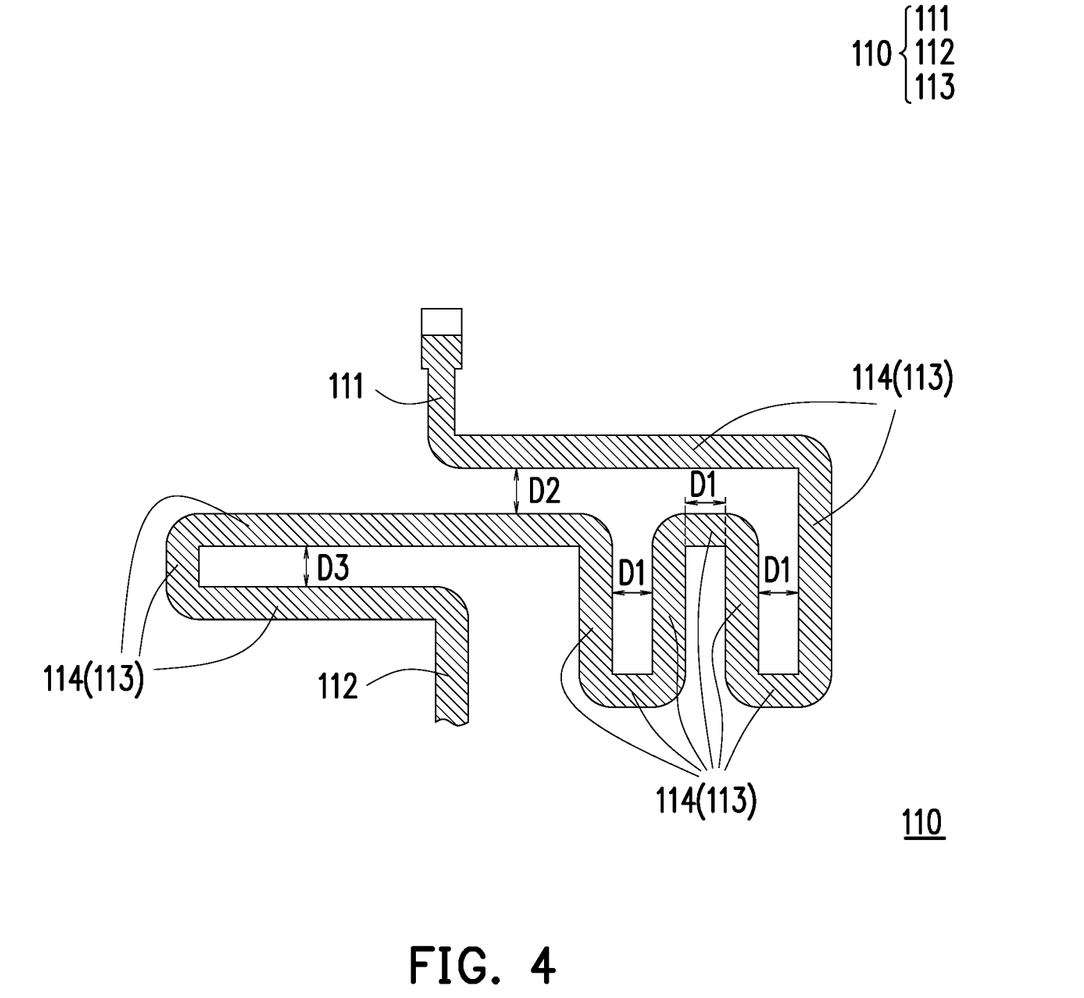
FIG. 4 is a partially enlarged top schematic view of the power distribution component of FIG. 3.

FIG. 4 is a partially enlarged top schematic view of the power distribution component of FIG. 3. Referring to FIG. 1, FIG. 3, and FIG. 4, a length L1 (FIG. 3) of the power distribution component 100 of this embodiment is between 6 mm and 10 mm, and a width W1 (FIG. 3) is between 4 mm and 6 mm. As shown in FIG. 4, the microstrip 113 of the wavelength converter 110 includes multiple first sections 114 that are bent and connected in sequence. Among the first sections 114, there are distances D1, D2, and D3 between any two adjacent and parallel first sections 114, and the distances D1, D2, and D3 are all between 0.1 mm and 0.3 mm. Thereby, the wavelength converter 110 may effectively reduce the coupling effect between the first sections 114 due to the design of the distances D1, D2, and D3 between the first sections 114. Therefore, the antenna component 14A (FIG. 1) and the antenna component 14B (FIG. 1) of the wireless transceiver 10 may have good performances in both return loss and isolation.

In this embodiment, when the distance D1 and the distance D2 are between 0.1 mm and 0.3 mm, and the distance D3 is between 0.2 mm and 0.3 mm, both the antenna component 14A and the antenna component 14B of the wireless transceiver 10 may have ideal isolation and a return loss of less than −20 dB, thus having good radiation performance.

Figure 5:
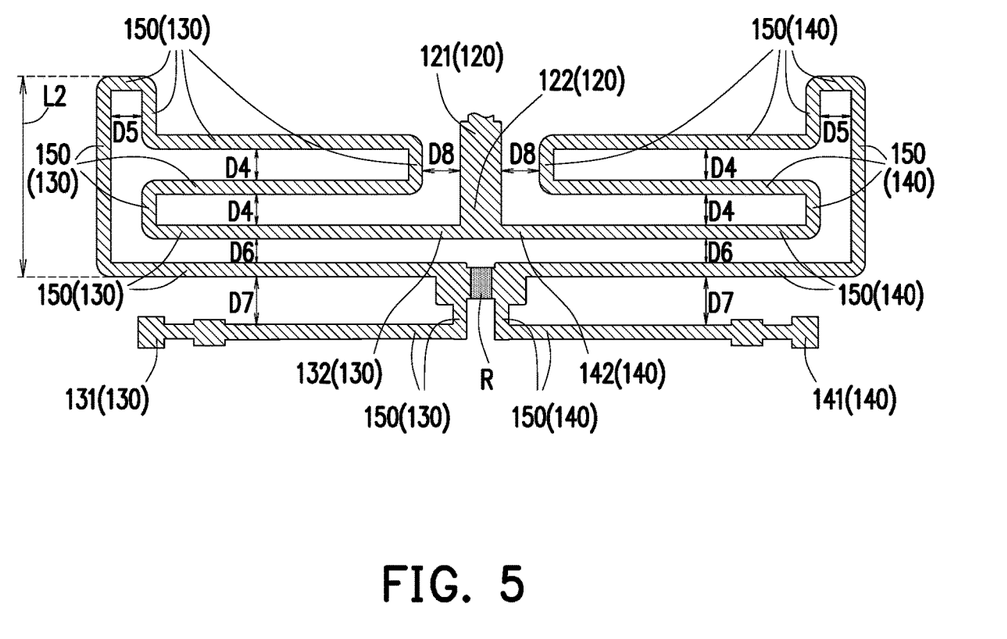
FIG. 5 is a partially enlarged top schematic view of the power distribution component of FIG. 3.

FIG. 5 is a partially enlarged top schematic view of the power distribution component of FIG. 3. Referring to FIG. 1, FIG. 3, and FIG. 5, any one of the first power distribution portion 130 or the second power distribution portion 140 of this embodiment includes multiple second sections 150 which are bent and connected in sequence. Among the second sections 150, a distance D4, a distance D5, a distance D6, and a distance D7 between any two adjacent and parallel second sections are all between 0.1 mm and 0.6 mm. In addition, a distance D8 between one of the second sections 150 that is closest to and parallel to the connecting portion 120 and the connecting portion 120 is between 0.1 mm and 0.3 mm.

Thereby, the first power distribution portion 130 and the second power distribution portion 140 of this embodiment may effectively reduce the coupling effect between the second sections 150 due to the design of the distances D4, D5, D6, D7, and D8. Therefore, the antenna component 14A (FIG. 1) and the antenna component 14B (FIG. 1) of the wireless transceiver 10 may have good performances in both return loss and isolation.

In this embodiment, when the distance D4 and the distance D5 are between 0.1 mm and mm, the distance D6 and the distance D8 are between 0.13 mm and 0.33 mm, and the distance D7 is between 0.35 mm and 0.55 mm, both the antenna component 14A and the antenna component 14B of the wireless transceiver 10 may have ideal isolation and a return loss of less than −20 dB, thus having good radiation performance.

In addition, a length L2 of the first power distribution portion 130 and the second power distribution portion 140 along the extending direction of the connecting portion 120 in this embodiment is between 1.8 mm and 2 mm. When the length L2 is longer, the frequency band resonated by the antenna component 14A and the antenna component 14B is shifted to a lower frequency. The wireless transceiver 10 may change the value of the frequency band resonated by the antenna component 14A and the antenna component 14B by adjusting the length L2 to achieve the effect of a customized design.

Furthermore, as shown in FIG. 5, a resistor R is disposed between the respective second sections 150 of the first power distribution portion 130 and the second power distribution portion 140 of this embodiment. Thereby the coupling effect between the second sections 150 located on the two sides of the resistor R may be reduced due to the high resistance value of the resistor R, so as to prevent the signals of the first power distribution portion 130 and the second power distribution portion 140 from interfering with each other. The antenna components 14A (FIG. 1) and 14B (FIG. 1) located on the two sides of the audio jack 12 also operate independently because the first power distribution portion 130 and the second power distribution portion 140 do not interfere with each other. The resistance value of the resistor R in this embodiment is 100 ohms, but the disclosure does not limit the resistance value of the resistor R.

Figure 6:
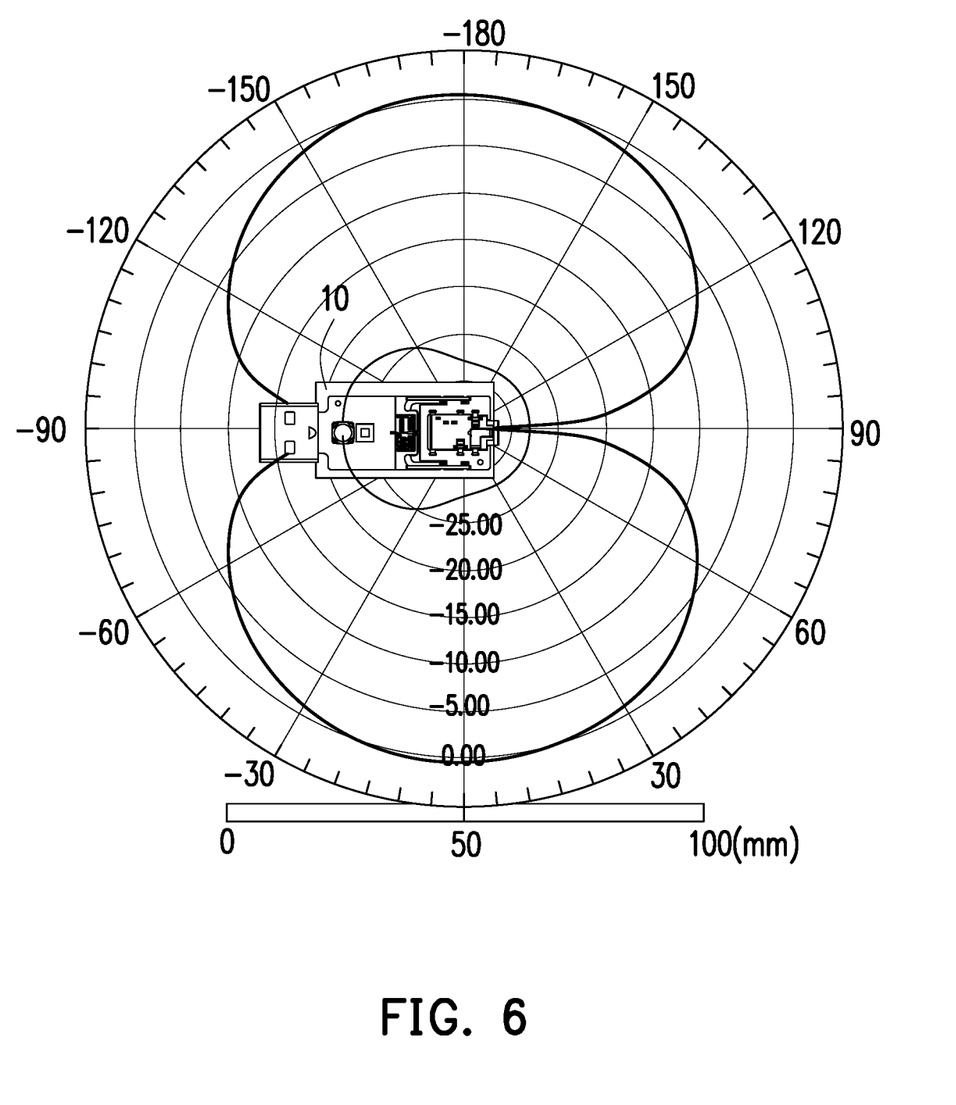
FIG. 6 is an antenna pattern distribution view of the wireless transceiver of FIG. 1.

FIG. 6 is an antenna pattern distribution view of the wireless transceiver of FIG. 1. Referring to FIG. 1 and FIG. 6, in this embodiment, when the antenna components 14A and 14B located on the two sides of the audio jack 12 operate at the same time, the antenna patterns excited by the antenna component 14A and antenna component 14B respectively located on the two sides of the audio jack 12 may be combined with each other to form the antenna pattern as shown in FIG. 6 and achieve excellent omnidirectional effects.

To sum up, in the power distribution component of the disclosure, because the first power distribution portion and the second power distribution portion are symmetrically disposed on opposite sides of the connecting portion by regarding the connecting portion as the mirror axis, the power distribution component may effectively divide the output power into two and subsequently transmit into the two antenna components electrically connected to the power distribution component. The two antenna components may operate independently at the same time due to the divided output power.

In the wireless transceiver of the disclosure, the two antenna components connected to the power distribution component are symmetrical and are symmetrically disposed on opposite sides of the audio jack. Thereby, the two antenna components may avoid the shielding of the audio jack and have good radiation performance, and the two antenna components may achieve excellent omnidirectional effects after combining the antenna patterns located on opposite sides of the audio jack. In addition, compared with the wireless transceiver including switches of the prior art, the wireless transceiver of the disclosure has good antenna radiation performance because two antenna components are disposed on opposite sides of the audio jack, thereby there is no need to dispose a switch for switching the operation state of the antenna, thus saving the cost of disposing a switch on the wireless transceiver.

Furthermore, the wireless transceiver of one embodiment may adjust the lengths of the microstrip, the first power distribution portion, and the second power distribution portion, so that the two antenna components may resonate in an ideal frequency band and achieve the effect of a customized design. The connecting portion, the microstrip, the first power distribution portion, and the second power distribution portion of one embodiment may adjust their respective widths to achieve ideal impedance matching, so that both the first output port of the first power distribution portion and the second output port of the second power distribution portion may obtain ideal output impedance and achieve a customized effect. In addition, the wavelength converter may effectively reduce the coupling effect between the first sections due to the design of the distances between the first sections, and the first power distribution portion and the second power distribution portion may also effectively reduce the coupling effect between the second sections due to the design of the distances between the second sections, therefore, the two antenna components of the wireless transceiver may have good performance in both the return loss and isolation.

What is claimed is:

1. A power distribution component, comprising:
    a wavelength converter, having an input end and a connection end;
    a connecting portion, comprising a first connecting end and a second connecting end, the first connecting end connecting to the connection end of the wavelength converter;
    a first power distribution portion, comprising a first output port and a first end, the first end connecting to the second connecting end of the connecting portion; and
    a second power distribution portion, comprising a second output port and a second end, the second end connecting to the second connecting end of the connecting portion;
    the first power distribution portion and the second power distribution portion symmetrically disposing on opposite sides of the connecting portion by regarding the connecting portion as a mirror axis,
    wherein the first output port of the first power distribution portion and the second output port of the second power distribution portion are adapted to be respectively connected to two antenna components, the two antenna components are adapted to resonate in a frequency band, and the wavelength converter comprises a microstrip whose length is ¼ times a wavelength of the frequency band.

2. The power distribution component according to claim 1, wherein a width of the connecting portion is greater than a width of the microstrip, and the width of the microstrip is greater than a width of either one of the first power distribution portion or the second power distribution portion.

3. The power distribution component according to claim 1, wherein the microstrip comprises a plurality of first sections that are bent and connected in sequence, and among the first sections, a distance between any two adjacent and parallel first sections is between 0.1 mm to 0.3 mm.

4. The power distribution component according to claim 1, wherein either one of the first power distribution portion or the second power distribution portion comprises a plurality of second sections that are bent and connected in sequence, and among the second sections, a distance between any two adjacent and parallel second sections is between 0.1 mm and 0.6 mm.

5. The power distribution component according to claim 4, wherein a distance between one of the second sections that is closest to and parallel to the connecting portion and the connecting portion is between 0.1 mm and 0.3 mm.

6. The power distribution component according to claim 1, wherein a length of the first power distribution portion and the second power distribution portion along an extending direction of the connecting portion is between 1.8 mm and 2 mm.

7. The power distribution component according to claim 1, wherein a length of the power distribution component is between 6 mm and 10 mm, and a width is between 4 mm and 6 mm.

8. The power distribution component according to claim 1, wherein a length of either one of the first power distribution portion or the second power distribution portion is ¼ times the wavelength of the frequency band.

* * * * *